United States Patent
Kanou et al.

(10) Patent No.: US 11,228,186 B2
(45) Date of Patent: Jan. 18, 2022

(54) CHARGER HAVING FAILURE DETECTION FUNCTION AND FAILURE DETECTION METHOD

(71) Applicant: FDK CORPORATION, Tokyo (JP)

(72) Inventors: Takashi Kanou, Tokyo (JP); Kenji Kitamura, Tokyo (JP); Yasunari Mizoguchi, Tokyo (JP)

(73) Assignee: FDK CORPORATION, Tokyo (JP)

( * ) Notice: Subject to any disclaimer, the term of this patent is extended or adjusted under 35 U.S.C. 154(b) by 0 days.

(21) Appl. No.: 16/982,037

(22) PCT Filed: Apr. 10, 2019

(86) PCT No.: PCT/JP2019/015562
§ 371 (c)(1),
(2) Date: Sep. 17, 2020

(87) PCT Pub. No.: WO2019/203080
PCT Pub. Date: Oct. 24, 2019

(65) Prior Publication Data
US 2021/0028633 A1    Jan. 28, 2021

(30) Foreign Application Priority Data
Apr. 19, 2018 (JP) .............................. JP2018-080747

(51) Int. Cl.
*H02J 7/00*    (2006.01)
*H01M 10/44*    (2006.01)

(52) U.S. Cl.
CPC ........... *H02J 7/0036* (2013.01); *H01M 10/44* (2013.01); *H02J 7/0029* (2013.01); *H02J 7/0047* (2013.01)

(58) Field of Classification Search
CPC ...... H02J 7/0036; H02J 7/0029; H02J 7/0047; H02J 7/00302; H02J 7/00304;
(Continued)

(56) References Cited

U.S. PATENT DOCUMENTS 10,374,444 B2 * 8/2019 Worry ................ G01R 31/3842
2015/0346282 A1 12/2015 Jeon
(Continued)

FOREIGN PATENT DOCUMENTS

EP     3240131 A1     11/2017
JP     H0745307 A     2/1995
(Continued)

OTHER PUBLICATIONS

International Search Report and Written Opinion dated Jun. 18, 2019, for corresponding PCT Application No. PCT/JP2019/015562.
(Continued)

*Primary Examiner* — Nathaniel R Pelton
(74) *Attorney, Agent, or Firm* — Kinney & Lange, P.A.

(57) ABSTRACT

A charger includes: a power supply device for charging a secondary battery; a power supply path that includes a first switch and a second switch, and supplies electric power from the power supply device to the secondary battery; a discharge circuit that includes a first resistor and a third switch, has one end connected to a connection point between the first switch and the second switch, and has the other end connected to a ground line; a short-circuit preventing circuit that includes a second resistor and a fourth switch, and is connected in parallel to the first switch; and a control device that controls open-close of each switch and acquires a voltage value $V_P$, wherein the control device detects a failure of each switch on a condition where the voltage value $V_P$ is different between a normal state and a failure state, in a combination of open-close control for each switch.

10 Claims, 1 Drawing Sheet

(58) Field of Classification Search
CPC .............. H02J 7/00306; H02J 7/00308; H02J 7/00309; H01M 10/44
USPC ........................................................ 320/134
See application file for complete search history.

(56) References Cited

U.S. PATENT DOCUMENTS

2019/0173274 A1* 6/2019 Fukae .................... H01M 10/48
2019/0204388 A1* 7/2019 Hamamoto ......... H01M 10/482

FOREIGN PATENT DOCUMENTS

| | | |
|---|---|---|
| JP | 2013181822 A | 9/2013 |
| JP | 2013205257 A | 10/2013 |
| JP | 2015008600 A | 1/2015 |
| JP | 2018170581 A | 11/2018 |
| WO | 2004088696 A1 | 10/2004 |

OTHER PUBLICATIONS

Extended European Search Report dated Nov. 12, 2021, received for corresponding European Application No. 19787966.1, seven pages.

* cited by examiner

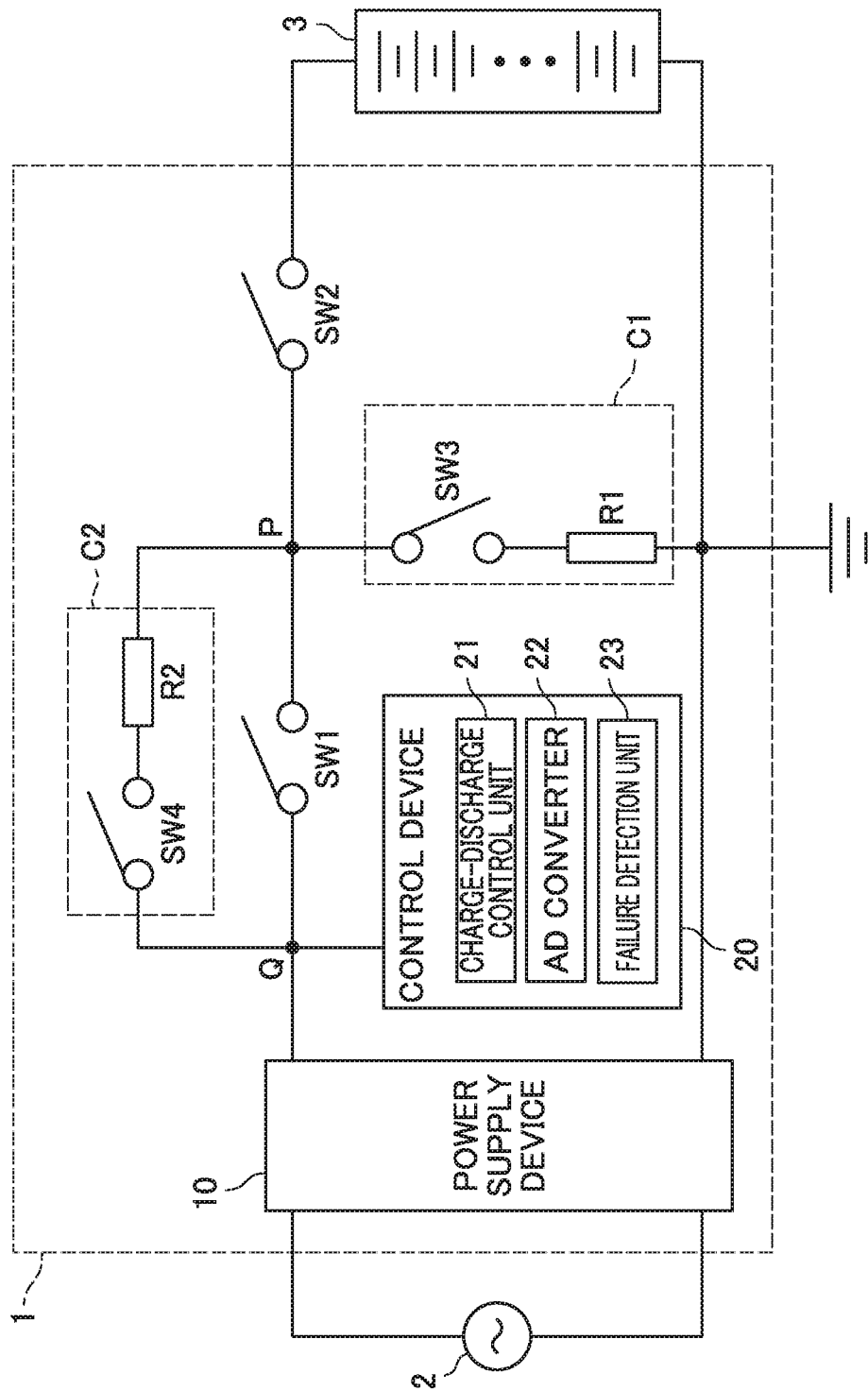

CHARGER HAVING FAILURE DETECTION FUNCTION AND FAILURE DETECTION METHOD

CROSS-REFERENCE TO RELATED APPLICATION(S)

This application is the national phase of PCT Application No. PCT/JP2019/015562 filed Apr. 10, 2019, which in turn claims priority to Japanese Application No. 2018-080747 filed on Apr. 19, 2018, both of which are incorporated by reference herein in their entireties.

BACKGROUND

Technical Field

The present disclosure relates to a charger having a failure detection function and a failure detection method.

Background Art

Secondary batteries such as nickel-metal hydride secondary batteries may have a phenomenon called a memory effect in which the capacity of the secondary battery seems to be reduced by repeating additional charge. Such a memory effect of secondary batteries can be restored by refresh-discharging. Refresh discharge means discharging a secondary battery until the battery voltage reaches the discharge end voltage. Then, for example, Patent Document 1 discloses a charger capable of refresh-discharging a secondary battery.

Now, a charger for charging a secondary battery may damage the secondary battery due to overcharging, in a case where the switch provided in the power supply path for supplying charging power to the secondary battery is short-circuited and the switch cannot be turned OFF even when the secondary battery reaches full charge. Therefore, the control device to control the charger preferably includes a failure detection function to detect failure of the switch, as disclosed in Patent Document 2, for example, by sensing a difference in voltage drops on the power supply path between cases where the switch in the power supply path is turned ON and where it is turned OFF.

PRIOR ART DOCUMENT

Patent Document

Patent Document 1: Japanese Patent Laid-Open No. 7-45307
Patent Document 2: Japanese Patent Laid-Open No. 2013-181822

SUMMARY

However, in the voltage drop on the power supply path described above, the potential difference decreases as the number of secondary batteries to be charged in series increases, and this makes it difficult to distinguish between a normal state and a failure state. More specifically, for example, in a control device having a failure detection function, when the power supply voltage required for operation is 5 V and the resolution of the AD converter that senses the difference in voltage drop is 10 bits, the voltage measurement accuracy is 5 V÷10 bits (1024)=4.88 mV. If the difference in the voltage drop to be measured is less than twice the measurement accuracy due to various conditions such as the increase in the number of secondary batteries in series or the impedance of the charging circuit, there may be a case where the switch failure cannot be detected. Further, in a case where an AD converter having a higher resolution is adopted in order to improve the measurement accuracy, the cost remarkably increases.

The present disclosure is designed with respect to such a situation, and an object thereof is to provide a charger having a failure detection function in which a low-resolution and inexpensive AD converter also can detect a switch failure.

To achieve the objective described above, a charger having a failure detection function of a first aspect of the present disclosure includes: a power supply device for outputting electric power for charging a secondary battery; a power supply path that includes a first switch and a second switch connected in series, and supplies the electric power from the power supply device to the secondary battery; a discharge circuit that includes a first resistor and a third switch connected in series, has one end connected to a connection point between the first switch and the second switch, and has the other end connected to a ground line; a short-circuit preventing circuit that includes a second resistor and a fourth switch connected in series, and is connected in parallel to the first switch; and a control device that controls open-close of each switch, and acquires a voltage value of the connection point, wherein the control device detects a failure of each switch on a condition where a voltage value at the connection point is different from a voltage value at the connection point of a case where each switch is normal, in a combination of open-close control for each switch.

According to the present disclosure, there can be provided a charger having a failure detection function in which a low-resolution and inexpensive AD converter also can detect a switch failure.

BRIEF DESCRIPTION OF THE DRAWINGS

FIG. 1 is a circuit diagram of a charger according to the present disclosure.

DETAILED DESCRIPTION

Embodiments of the present disclosure are described below in detail with reference to the drawing. It should be noted that the present disclosure is not limited to the contents described below, and may be implemented by optionally changing it within a range without changing the gist of the disclosure. Further, the drawing used for the description of the embodiments all schematically shows components, uses partial emphasis, enlargement, reduction, or omission in order to deepen understanding, and may not accurately represent the scale, shape, or the like of the components.

First, a configuration of a charger 1 according to the present disclosure is described below. FIG. 1 is a circuit diagram of the charger 1 according to the present disclosure. The charger 1 is a charger having a failure detection function. The charger 1 converts electric power input from an external power supply 2 as a commercial AC power supply and outputs charging power to charge a secondary battery 3, and can refresh-discharge the secondary battery 3 as necessary. Here, in this embodiment, it is assumed that the secondary battery 3 to be charged includes 20 nickel-metal hydride batteries having a rated voltage of 1.2 V connected in series.

The charger 1 includes a power supply device 10, a first switch SW1, a second switch SW2, a discharge circuit C1, a short-circuit preventing circuit C2, and a control device 20.

The power supply device 10 converts AC power supplied from the external power supply 2 into DC power, converts it into a voltage suitable for charging the secondary battery 3, and outputs the voltage as a power supply voltage $V_S$. Here, in a case where the charger 1 is a portable type charging device, the power supply device 10 may be configured to include a separate battery so that it can output charging power without being connected to the external power supply 2. In addition, in this embodiment, the power supply device 10 outputs the power supply voltage $V_S$ of 30 V as the charging power for charging the secondary battery 3.

The first switch SW1 and the second switch SW2 are provided in series on a power supply path for supplying charging power from the power supply device 10 to the secondary battery 3, and both are controlled to be ON in a case of charging the secondary battery 3.

The discharge circuit C1 includes a first resistor R1 and a third switch SW3 connected in series, has one end connected to a connection point P between the first switch SW1 and the second switch SW2, and has the other end connected to a ground line. Here, in this embodiment, the low potential side terminals of the power supply device 10 and the secondary battery 3 are also connected to the ground line.

The short-circuit preventing circuit C2 includes a second resistor R2 and a fourth switch SW4 connected in series, and is connected in parallel to the first switch SW1. That is, the short-circuit preventing circuit C2 has one end connected to the connection point P, and the other end connected to a connection point Q between the power supply device 10 and one end of the first switch SW1.

Here, each of the first switch SW1, the second switch SW2, the third switch SW3, and the fourth switch SW4 can adopt various switching elements such as a MOSFET, a bipolar transistor, or an IGBT.

Further, the resistance value of the first resistor R1 is set according to the value of the discharge current when the secondary battery 3 is refresh-discharged. The resistance value of the second resistor R2 is set according to the value of charging current in a case of charging the secondary battery 3 in an over-discharged state.

The control device 20 is a well-known microcomputer control circuit, and integrally controls the entire charger 1. Further, in this embodiment, the control device 20 is connected to the connection point Q to be operated by electric power supplied from the power supply device 10 via a regulator (not shown). The control device 20 controls open-close of each of the first switch SW1, the second switch SW2, the third switch SW3, and the fourth switch SW4, and acquires a voltage value $V_P$ of the connection point P described above to detect the failure of each switch, as described below.

More specifically, the control device 20 includes a charge-discharge control unit 21, an AD converter 22, and a failure detection unit 23.

At a time of charging the secondary battery 3, the charge-discharge control unit 21 controls the first switch SW1 and the second switch SW2 to be ON, and controls the third switch SW3 and the fourth switch SW4 to be OFF. This establishes a power supply path that passes through the connection point Q, the first switch SW1, the connection point P, and the second switch SW2, to charge the secondary battery 3 with electric power supplied from the power supply device 10.

Further, at a time of refresh discharge for eliminating the memory effect of the secondary battery 3, the charge-discharge control unit 21 controls the second switch SW2 and the third switch SW3 to be ON, and controls the first switch SW1 and the fourth switch SW4 to be OFF. This establishes a discharge path that is connected to the ground line via the second switch SW2, the connection point P, the third switch SW3, and the first resistor R1, and causes the first resistor R1 to consume electric power, to discharge the secondary battery 3 until the battery voltage $V_B$ reaches the discharge end voltage. Then, the secondary battery 3 is charged until it is fully charged by the above-described charging procedure.

Here, the charge-discharge control unit 21 controls the second switch SW2 and the fourth switch SW4 to be ON and controls the first switch SW1 and the third switch SW3 to be OFF when there is no load in a case where the secondary battery 3 is short-circuited. This allows the control device 20 to raise the potential of the connection point Q from 0 V by the voltage drop due to the second resistor R2, on the conductive path passing through the connection point Q, the fourth switch SW4, the second resistor R2, the connection point P, and the second switch SW2, to continue to be input the electric power required for operation.

The AD converter 22 is a conversion circuit for converting the analog voltage value $V_P$ at the connection point P into a digital value to acquire it, and in this embodiment, it is quantized with 10 bits. Further, although there is illustrated the embodiment in which the AD converter 22 is incorporated in the control device 20, the AD converter 22 may be provided outside the control device 20 to be connected thereto.

The failure detection unit 23 detects a failure in each of the above-described switches based on the voltage value $V_P$ at the connection point P that the AD converter 22 acquires, as is described below in detail.

Next, for the case where each switch of the charger 1 is normal without any failure, a description is made on combinations in which the control device 20 controls the open-close of each switch and the voltage values $V_P$ at the connection point P at these states.

Table 1 shows the combinations of control signals to each switch. More specifically, of the combinations of open-close control that the control device 20 outputs to each switch, Table 1 shows the condition where all are turned OFF and each of the conditions where any one of the switches is only turned ON.

TABLE 1

| Combination of control signal to each switch | | | | |
| --- | --- | --- | --- | --- |
| | SW1 | SW2 | SW3 | SW4 | Voltage value $V_P$ |
| Condition 1 | OFF | OFF | OFF | OFF | 0 V |
| Condition 2 | ON | OFF | OFF | OFF | Power supply voltage $V_S$ |
| Condition 3 | OFF | ON | OFF | OFF | Battery voltage $V_B$ |
| Condition 4 | OFF | OFF | ON | OFF | 0 V |
| Condition 5 | OFF | OFF | OFF | ON | Power supply voltage $V_S$ |

Condition 1 is a control signal of the combination to control all the switches to be OFF. When the charge-discharge control unit 21 outputs the control signal under the condition 1 as a "first combination condition", the connection point P on the circuit of the charger 1 is not connected to any of the power supply device 10, the secondary battery 3, and the ground line. Therefore, the voltage value $V_P$ at the connection point P under the condition 1 is measured by the AD converter 22 as 0 V.

Condition 2 is a control signal of the combination to control the first switch SW1 to be ON and the other switches to be OFF. When the charge-discharge control unit 21 outputs the control signal under the condition 2, the connection point P on the circuit of the charger 1 is connected to the power supply device 10. Therefore, the voltage value $V_P$ at the connection point P under the condition 2 is measured by the AD converter 22 as the power supply voltage $V_S$.

Condition 3 is a control signal of a combination to control the second switch SW2 to be ON and the other switches to be OFF. When the charge-discharge control unit 21 outputs the control signal under the condition 3, the connection point P on the circuit of the charger 1 is connected to the secondary battery 3. Therefore, the voltage value $V_P$ at the connection point P under the condition 3 is measured by the AD converter 22 as the battery voltage $V_B$.

Condition 4 is a control signal of a combination to control the third switch SW3 to be ON and the other switches to be OFF. When the charge-discharge control unit 21 outputs the control signal under the condition 4 as a "second combination condition", the connection point P on the circuit of the charger 1 is connected to the ground line. Therefore, the voltage value $V_P$ at the connection point P under the condition 4 is measured by the AD converter 22 as 0 V.

Condition 5 is a control signal of a combination to control the fourth switch SW4 to be ON and the other switches to be OFF. When the charge-discharge control unit 21 outputs the control signal under the condition 5 as a "third combination condition", the connection point P on the circuit of the charger 1 is connected to the power supply device 10. Therefore, the voltage value $V_P$ at the connection point P under the condition 5 is measured by the AD converter 22 as the power supply voltage $V_S$.

As described above, when each switch is normal, the voltage value $V_P$ at the connection point P is measured as one of 0 V, the power supply voltage $V_S$, and the battery voltage $V_B$ depending on the combination of the control signal to each switch.

Here, the battery voltage $V_B$ described above changes depending on the state of charge (SOC) of the secondary battery 3, but the voltage range where the output voltage of the secondary battery 3 can take is known. Therefore, by determining whether the voltage value $V_P$ is included in the voltage range, the control device 20 can distinguish whether the voltage value $V_P$ is the battery voltage $V_B$ without performing arithmetic processing such as sequentially measuring and collating the output voltage of the secondary battery 3. More specifically, the secondary battery 3 of this embodiment has a battery voltage $V_B$ of 22 V with the SOC being 0%, and a battery voltage $V_B$ of 28 V with the SOC being 100%.

Next, description is made below on possibility of the failure detection in each condition and each switch with a failure, in cases where one of the switches of the charger 1 has a short-circuit failure. Table 2 shows the possibility of the failure detection for each combination of the control signal. More specifically, Table 2 shows the voltage value $V_P$ of the connection point P with respect to the failed switch and whether the failure can be detected, under each of the conditions 1 to 5 described above.

TABLE 2

Possibility of failure detection in combination of control signal

| | Voltage value $V_P$ at normal state | Switch with failure | Voltage value $V_P$ at failure state | Possibility of failure detection |
|---|---|---|---|---|
| Condition 1 | 0 V | SW1 with failure | Power supply voltage $V_S$ | Possible |
| | | SW2 with failure | Battery voltage $V_B$ | Possible |
| | | SW3 with failure | 0 V | Impossible |
| | | SW4 with failure | Power supply voltage $V_S$ | Possible |
| Condition 2 | Power supply voltage $V_S$ | SW1 with failure | Power supply voltage $V_S$ | Impossible |
| | | SW2 with failure | Battery voltage $V_B$ | Possible |
| | | SW3 with failure | Power supply voltage $V_S$ | Impossible |
| | | SW4 with failure | Power supply voltage $V_S$ | Impossible |
| Condition 3 | Battery voltage $V_B$ | SW1 with failure | Battery voltage $V_B$ | Impossible |
| | | SW2 with failure | Battery voltage $V_B$ | Impossible |
| | | SW3 with failure | Battery voltage $V_B$ | Impossible |
| | | SW4 with failure | Battery voltage $V_B$ | Impossible |
| Condition 4 | 0 V | SW1 with failure | Power supply voltage $V_S$ | Possible |
| | | SW2 with failure | Battery voltage $V_B$ | Possible |
| | | SW3 with failure | 0 V | Impossible |
| | | SW4 with failure | α × Power supply voltage $V_S$ | Possible |
| Condition 5 | Power supply voltage $V_S$ | SW1 with failure | Power supply voltage $V_S$ | Impossible |
| | | SW2 with failure | Battery voltage $V_B$ | Possible |
| | | SW3 with failure | α × Power supply voltage $V_S$ | Possible |
| | | SW4 with failure | Power supply voltage $V_S$ | Impossible |

<Possibility of Failure Detection by Control of Condition 1>

In the condition 1, when the first switch SW1 has a short-circuit failure, the connection point P is connected to the power supply device 10, and thus the voltage value $V_P$ is measured as the power supply voltage $V_S$. Therefore, the failure detection unit 23 can detect that the voltage value $V_P$ at the connection point P is different from that at the normal state.

In the condition 1, when the second switch SW2 has a short-circuit failure, the connection point P is connected to the secondary battery 3, so that the voltage value $V_P$ is measured as the battery voltage $V_B$. Therefore, the failure detection unit 23 can detect that the voltage value $V_P$ at the connection point P is different from that at the normal state.

In the condition 1, when the third switch SW3 has a short-circuit failure, the connection point P is connected to the ground line, so that the voltage value $V_P$ is measured as 0 V. Therefore, the failure detection unit 23 cannot detect that the voltage value $V_P$ at the connection point P is different from that at the normal state.

In the condition 1, when the fourth switch SW4 has a short-circuit failure, the connection point P is connected to the power supply device 10, so that the voltage value $V_P$ is measured as the power supply voltage $V_S$. Therefore, the failure detection unit 23 can detect that the voltage value $V_P$ at the connection point P is different from that at the normal state.

As described above, in the control device 20, when the charge-discharge control unit 21 controls in the condition 1, the failure detection unit 23 can detect a short-circuit failure of any of the first switch SW1, the second switch SW2, and the fourth switch SW4 based on the voltage value $V_P$ at the connection point P that the AD converter 22 measures.

Here, although detailed description is omitted for possibility of the failure detection in the control of condition 2 and condition 3, the control of condition 2 can detect only the short-circuit failure of the second switch SW2, and the control of condition 3 cannot detect any short-circuit failure.

<Possibility of Failure Detection by Control of Condition 4>

In the condition 4, when the first switch SW1 has a short-circuit failure, the connection point P is connected to the power supply device 10 via the first switch SW1 and also connected to the ground line via the discharge circuit C1. At this time, the first resistor R1 of the discharge circuit C1 is in a state where the power supply voltage $V_S$ is applied. Then, the voltage value $V_P$ at the connection point P is measured as the power supply voltage $V_S$. Therefore, the failure detection unit 23 can detect that the voltage value $V_P$ at the connection point P is different from that at the normal state.

In the condition 4, when the second switch SW2 has a short-circuit failure, the connection point P is connected to the secondary battery 3 via the second switch SW2 and is connected to the ground line via the discharge circuit C1. At this time, the first resistor R1 of the discharge circuit C1 is in a state where the battery voltage $V_B$ is applied. Then, the voltage value $V_P$ at the connection point P is measured as the battery voltage $V_B$. Therefore, the failure detection unit 23 can detect that the voltage value $V_P$ at the connection point P is different from that at the normal state.

In the condition 4, when the third switch SW3 has a short-circuit failure, the connection point P is connected to the ground line, so that the voltage value $V_P$ is measured as 0 V. Therefore, the failure detection unit 23 cannot detect that the voltage value $V_P$ at the connection point P is different from that at the normal state.

In the condition 4, when the fourth switch SW4 has a short-circuit failure, the connection point P is connected to the power supply device 10 via the short-circuit preventing circuit C2 and is connected to the ground line via the discharge circuit C1. At this time, a conductive path from the power supply device 10 to the ground line is formed via the connection point Q, the short-circuit preventing circuit C2, the connection point P, and the discharge circuit C1. Then, the voltage value $V_P$ of the connection point P is measured as a voltage obtained by dividing the power supply voltage $V_S$ by the first resistor R1 and the second resistor R2 ($\alpha \times$power supply voltage $V_S$). Here, $\alpha$ is a constant determined by the ratio of the resistance values of the first resistor R1 and the second resistor R2. Therefore, the failure detection unit 23 can detect that the voltage value $V_P$ at the connection point P is different from that at the normal state.

In this way, in the control device 20, when the charge-discharge control unit 21 is in control of the condition 4, the failure detection unit 23 can detect a short-circuit failure of any of the first switch SW1, the second switch SW2, and the fourth switch SW4, based on the voltage value $V_P$ at the connection point P that the AD converter 22 measures.

<Possibility of Failure Detection by Control of Condition 5>

In condition 5, when the first switch SW1 has a short-circuit failure, the connection point P is connected to the power supply device 10 via both the first switch SW1 and the short-circuit preventing circuit C2 connected in parallel. Then, the voltage value $V_P$ at the connection point P is measured as the power supply voltage $V_S$. Therefore, the failure detection unit 23 cannot detect the short-circuit failure of the first switch SW1.

In the condition 5, when the second switch SW2 has a short-circuit failure, the connection point P is connected to the secondary battery 3 via the second switch SW2 and also connected to the power supply device 10 via the short-circuit preventing circuit C2. At this state, the second resistor R2 of the short-circuit preventing circuit C2 steps down the power supply voltage $V_S$ of the power supply device 10 to the battery voltage $V_B$. Then, the voltage value $V_P$ at the connection point P is measured as the battery voltage $V_B$. Therefore, the failure detection unit 23 can detect that the voltage value $V_P$ at the connection point P is different from that at the normal state.

In the condition 5, when the third switch SW3 has a short-circuit failure, the connection point P is connected to the power supply device 10 via the short-circuit preventing circuit C2 and is connected to the ground line via the discharge circuit C1. At this time, a conductive path from the power supply device 10 to the ground line is formed via the connection point Q, the short-circuit preventing circuit C2, the connection point P, and the discharge circuit C1. Then, the voltage value $V_P$ of the connection point P is measured as a voltage obtained by dividing the power supply voltage $V_S$ by the first resistor R1 and the second resistor R2 ($\alpha \times$power supply voltage $V_S$). Therefore, the failure detection unit 23 can detect that the voltage value $V_P$ at the connection point P is different from that at the normal state.

In the condition 5, when the fourth switch SW4 has a short-circuit failure, the connection point P is connected to the power supply device 10, so that the voltage value $V_P$ is measured as the power supply voltage $V_S$. Therefore, the failure detection unit 23 cannot detect that the voltage value $V_P$ at the connection point P is different from that at the normal state.

Thus, in the control device 20, when the charge-discharge control unit 21 is in control of the condition 5, the failure detection unit 23 can detect a short-circuit failure of the second switch SW2 and the third switch SW3, based on the voltage value $V_P$ at the connection point P that the AD converter 22 measures.

Next, description is made below on an example of a failure detection method for a short-circuit failure of a switch that the control device 20 performs based on the difference in the voltage value $V_P$ between the normal state and the failure state. The charger 1 executes the following failure detection method, for example, immediately before charging the secondary battery 3 or immediately before refresh-discharging it.

First, the control device 20 controls all the switches to be OFF according to the above-described condition 1, and measures the voltage value $V_P$ at the connection point P. Then, in the case where the voltage value $V_P$ is measured as the power supply voltage $V_S$ or the battery voltage $V_B$, the control device 20 determines that any of the first switch SW1, the second switch SW2, or the fourth switch SW4 is short-circuited to detect switch failure.

Next, the control device 20 controls the first switch SW1, the second switch SW2, and the third switch SW3 to be OFF and controls the fourth switch to be ON according to the above-described condition 5. The control device 20 also measures the voltage value $V_P$ at the connection point P. Then, when the voltage value $V_P$ is measured as a voltage different from the power supply voltage $V_S$, the control device 20 determines that the second switch SW2 or the third switch SW3 is short-circuited to detect a switch failure.

Then, when no switch failure is detected in both the condition 1 and condition 5, the control device 20 determines that each switch is normal and starts charge or refresh discharge of the secondary battery 3.

When a switch failure is detected in at least one of condition 1 and condition 5, the control device 20 determines that there is a switch having a short-circuit failure, and stops charge or refresh discharge of the secondary battery 3. At this time, the charger 1 may be separately provided with failure notification means to notify the user of the occurrence of the failure. The failure notification means may include various aspects such as lighting an LED, displaying on a display, or outputting a buzzer sound.

In this way, the control device 20 can detect all short-circuit failures of the first switch SW1, the second switch SW2, the third switch SW3, and the fourth switch SW4 by measuring the voltage value $V_P$ at the connection point P in each control of condition 1 and condition 5. Further, for the same reason, control including each of the condition 4 and the condition 5 can detect the short-circuit failure of all the switches. In the failure detection, the order of the condition 1 and the condition 5, and the order of the condition 4 and the condition 5 do not matter.

As mentioned above, the charger 1 according to the present disclosure includes the first switch SW1 connected to the power supply device 10, the second switch SW2 connected to the secondary battery 3, the third switch SW3 included in the discharge circuit C1 connected to the ground line, and the fourth switch SW4 included in the short-circuit preventing circuit C2 connected to the power supply device 10. Further, the charger 1 has a circuit configuration having a connection point P that is not connected to any of the power supply device 10, the secondary battery 3, and the ground line when all the switches are OFF. Therefore, the charger 1 can detect a short-circuit failure of each switch by distinguishing whether the voltage value $V_P$ at the connection point P is the power supply voltage $V_S$, the battery voltage $V_B$, 0 V, or $\alpha \times$ power supply voltage $V_S$ in the combination of open-close control for each switch. At this time, there is a sufficient difference in the height of each voltage, so that the charger 1 can distinguish these voltages if the AD converter 22 has a low resolution. Therefore, according to the charger 1 of the present disclosure, even a low-resolution and inexpensive AD converter 22 can detect a switch failure.

Although the description on embodiments finishes here, the present disclosure is not limited to the above-described embodiments. For example, in the above-described embodiment, the aspects to detect the short-circuit failure of each switch have been illustrated, but it is also possible to detect an open-circuit failure where some switches are turned OFF against ON control, for a part of the switches.

More specifically, in a case where the first switch SW1 has an open-circuit failure in the above-described condition 2 where only the first switch SW1 is controlled to be ON, the voltage value $V_P$ at the connection point P becomes 0 V instead of the power supply voltage $V_S$. Therefore, the charger 1 according to the present disclosure can detect the open-circuit failure of the first switch SW1.

Similarly, in a case where the second switch SW2 has an open-circuit failure in the above-described condition 3 where only the second switch SW2 is controlled to be ON, the voltage value $V_P$ at the connection point P becomes 0 V instead of the battery voltage $V_B$. Therefore, the charger 1 according to the present disclosure can detect the open-circuit failure of the second switch SW2.

Similarly, in a case where the fourth switch SW4 has an open-circuit failure in the above-described condition 5 where only the fourth switch SW4 is controlled to be ON, the voltage value $V_P$ at the connection point P becomes 0 V instead of the battery voltage $V_B$. Therefore, the charger 1 according to the present disclosure can detect the open-circuit failure of the fourth switch SW4.

Then, the charger 1 according to the present disclosure may combine any of a plurality of failure short-circuit failure detections and a plurality of open-circuit failure detections in the above-described conditions.

<Aspects of the Present Disclosure>

A first aspect of the present disclosure is a charger having a failure detection function, including: a power supply device for outputting electric power for charging a secondary battery; a power supply path that includes a first switch and a second switch connected in series, and supplies the electric power from the power supply device to the secondary battery; a discharge circuit that includes a first resistor and a third switch connected in series, has one end connected to a connection point between the first switch and the second switch, and has the other end connected to a ground line; a short-circuit preventing circuit that includes a second resistor and a fourth switch connected in series, and is connected in parallel to the first switch; and a control device that controls open-close of each switch, and acquires a voltage value of the connection point, wherein the control device detects a failure of each switch on a condition where a voltage value at the connection point is different from a voltage value at the connection point of a case where each switch is normal, in a combination of open-close control for each switch.

The charger having a failure detection function includes the first switch connected to the power supply device, a second switch connected to the secondary battery, a third switch included in the discharge circuit connected to the ground line, and the fourth switch included in the short-circuit preventing circuit connected to the power supply device. Further, the charger having a failure detection function has a circuit configuration where the connection point between the first switch and the second switch is not connected to any of the power supply device, the secondary battery, and the ground line in the case where all the switches are OFF. Therefore, the charger having a failure detection function can detect the short-circuit failure of each switch, by distinguishing whether a voltage value at the connection point is any of the power supply voltage of the power supply device, the battery voltage of the secondary battery, 0 V, and the voltage obtained by dividing the power supply voltage of the power supply device, in the combination of open-close control for each switch. At this time, there is a sufficient difference in the height of each voltage, the charger having a failure detection function can distinguish these voltages if the built-in AD converter has a low resolution. Therefore, according to the charger having a failure detection function of the first aspect of the present invention, a low-resolution and inexpensive AD converter also can detect a switch failure.

A second aspect of the present disclosure is the charger having a failure detection function according to the above-described first aspect of the present disclosure, wherein the control device detects a failure of the first switch, the second switch, or the fourth switch on a condition where a voltage value at the connection point is different from 0 V, in the first combination condition where all the switches are controlled to be OFF.

In the charger having a failure detection function, when all the switches are normal in the condition where all the switches are controlled to be OFF, the voltage value is 0 V at the connection point between the first switch and the second switch. On the other hand, when any of the first switch, the second switch, and the fourth switch has a short-circuit failure, in the same condition, the voltage value at the connection point becomes a voltage other than 0 V. Therefore, according to the charger having a failure detection function of the second aspect of the present disclosure, it is possible to detect a failure of the fourth switch as well as the first switch and the second switch provided in the power supply path that supplies the charging power from the power supply device to the secondary battery.

A third aspect of the present disclosure is the charger having a failure detection function according to the above-described first aspect of the present disclosure, wherein the control device detects a failure of the first switch, the second switch, or the fourth switch on a condition where a voltage value at the connection point is different from 0 V, in a second combination condition where the first switch, the second switch, and the fourth switch are controlled to be OFF, and the third switch is controlled to be ON.

In the charger having a failure detection function, when all the switches are normal in the condition where only the third switch out of all the switches is controlled to be ON, the voltage value becomes 0 V at the connection point between the first switch and the second switch. On the other hand, when any of the first switch, the second switch, and the fourth switch has a short-circuit failure, in the same condition, the voltage value at the connection point becomes a voltage other than 0 V. Therefore, according to the charger having a failure detection function of the third aspect of the present disclosure, it is possible to detect a failure of the fourth switch as well as the first switch and the second switch provided in the power supply path that supplies the charging power from the power supply device to the secondary battery.

A fourth aspect of the present disclosure is the charger having a failure detection function according to the above-described second or third aspect of the present disclosure, wherein the control device detects a failure of the third switch on a condition where a voltage value at the connection point is different from the power supply voltage of the power supply device, in a third combination condition where the first switch, the second switch, and the third switch are controlled to be OFF, and the fourth switch is controlled to be ON.

In the charger having a failure detection function, when all the switches are normal in a condition where only the fourth switch out of all the switches is controlled to be ON, the voltage value at the connection point between the first switch and the second switch becomes the power supply voltage of the power supply device. On the other hand, when the third switch has a short-circuit failure in the same condition, the voltage value becomes a voltage obtained by dividing the power supply voltage at the connection point. Therefore, according to the charger having a failure detection function of the fourth aspect of the present disclosure, a short-circuit failure of the first switch, the second switch, and the fourth switch can be detected in the first combination condition, and a failure of the third switch can be detected in the third combination condition, and thereby a short-circuit failure of all switches can be detected in a small number of conditions.

A fifth aspect of the present disclosure is a failure detection method, wherein a charger having a failure detection function includes: a power supply device for outputting electric power for charging a secondary battery; a power supply path that includes a first switch and a second switch connected in series, and supplies the electric power from the power supply device to the secondary battery; a discharge circuit that includes a first resistor and a third switch connected in series, has one end connected to a connection point between the first switch and the second switch, and has the other end connected to a ground line; a short-circuit preventing circuit that includes a second resistor and a fourth switch connected in series, and is connected in parallel to the first switch; and a control device that controls open-close of each switch, and acquires a voltage value of the connection point, and wherein a failure of each switch is detected on a condition where a voltage value at the connection point is different from a voltage value at the connection point of a case where each switch is normal, in a combination of open-close control for each switch.

The charger having a failure detection function includes the first switch connected to the power supply device, a second switch connected to the secondary battery, a third switch included in the discharge circuit connected to the ground line, and the fourth switch included in the short-circuit preventing circuit connected to the power supply device. Further, the charger having a failure detection function has a circuit configuration where the connection point between the first switch and the second switch is not connected to any of the power supply device, the secondary battery, and the ground line in the case where all the switches are OFF. Thus, in the charger having a failure detection function, the failure detection method distinguishes which voltage value is applied at the connection point out of the power supply voltage of the power supply device, the battery voltage of the secondary battery, 0 V, or a voltage obtained by dividing the power supply voltage of the power supply device, in the combinations of open-close control for each switch, and thereby the failure detection method can detect a short-circuit failure in each switch. At this time, there is a sufficient difference in the height of each voltage, the charger having a failure detection function can distinguish these voltages if the built-in AD converter has a low resolution. Therefore, according to the failure detection method of the fifth aspect of the present disclosure, a low-resolution and inexpensive AD converter also can detect a switch failure.

A sixth aspect of the present disclosure is a failure detection method according to the above-described fifth aspect of the present disclosure, wherein a failure of the first switch, the second switch, or the fourth switch is detected on a condition where a voltage value at the connection point is different from 0 V, in a first combination condition where all the switches are controlled to be OFF.

In the charger having a failure detection function, when all the switches are normal in the condition where all the switches are controlled to be OFF, the voltage value is 0 V at the connection point between the first switch and the second switch. On the other hand, when any of the first switch, the second switch, and the fourth switch has a short-circuit failure, in the same condition, the voltage value at the connection point becomes a voltage other than 0 V. Therefore, according to the failure detection method of the sixth aspect of the present disclosure, a failure of the fourth switch can be detected, in addition to the failures of the first switch and the second switch provided in the power supply path for supplying the charging power from the power supply device to the secondary battery.

A seventh aspect of the present disclosure is the failure detection method according to the above-described fifth aspect of the present disclosure, wherein a failure of the first switch, the second switch, or the fourth switch is detected on a condition where a voltage value at the connection point is different from 0 V, in a second combination condition where the first switch, the second switch, and the fourth switch are controlled to be OFF, and the third switch is controlled to be ON.

In the charger having a failure detection function, when all the switches are normal in the condition where all the switches are controlled to be OFF, the voltage value is 0 V at the connection point between the first switch and the second switch. On the other hand, when any of the first switch, the second switch, and the fourth switch has a short-circuit failure, in the same condition, the voltage value at the connection point becomes a voltage other than 0 V. Therefore, according to the failure detection method of the seventh aspect of the present disclosure, a failure of the fourth switch can be detected, in addition to the failures of the first switch and the second switch provided in the power supply path for supplying the charging power from the power supply device to the secondary battery.

An eighth aspect of the present disclosure is a failure detection method according to the above-described sixth or seventh aspect of the present disclosure, wherein a failure of the third switch is detected on a condition where a voltage value at the connection point is different from the power supply voltage of the power supply device, in a third combination condition where the first switch, the second switch, and the third switch are controlled to be OFF, and the fourth switch is controlled to be ON.

In the charger having a failure detection function, when all the switches are normal in a condition where only the fourth switch out of all the switches is controlled to be ON, the voltage value at the connection point between the first switch and the second switch becomes the power supply voltage of the power supply device. On the other hand, when the third switch has a short-circuit failure in the same condition, the voltage value becomes a voltage obtained by dividing the power supply voltage at the connection point. Therefore, according to the failure detection method of the eighth aspect of the present disclosure, a short-circuit failure of the first switch, the second switch, and the fourth switch can be detected in the first combination condition, and a failure of the third switch can be detected in the third combination condition, and thereby a short-circuit failure of all switches can be detected in a small number of conditions.

EXPLANATION OF REFERENCE SIGNS 1 charger
2 external power supply
3 secondary battery
10 power supply device
20 control device
21 charge-discharge control unit
22 AD converter
23 failure detection unit
SW1 to SW4 first to fourth switches
R1, R2 first resistor, second resistor
C1 discharge circuit
C2 short-circuit preventing circuit

The invention claimed is:

1. A charger having a failure detection function, the charger comprising:
   a power supply device for outputting electric power for charging a secondary battery;
   a power supply path that includes a first switch and a second switch connected in series, and supplies the electric power from the power supply device to the secondary battery;
   a discharge circuit that includes a first resistor and a third switch connected in series, has a first end connected to a connection point between the first switch and the second switch, and has a second end connected to a ground line;
   a short-circuit preventing circuit that includes a second resistor and a fourth switch connected in series, and is connected in parallel to the first switch; and
   a control device that controls open-close of each switch, and acquires a voltage value of the connection point,
   wherein the control device detects a failure of each switch by detecting a condition where the voltage value at the connection point is different from a normal voltage value at the connection point for normal operation of each switch, in a combination of open-close control for each switch.

2. The charger having a failure detection function according to claim 1, wherein:
   the control device detects a failure of the first switch, the second switch, or the fourth switch by detecting a condition where the voltage value at the connection point is different from 0 V, in a first combination condition where all the switches are controlled to be OFF.

3. The charger having a failure detection function according to claim 2, wherein
   the control device detects a failure of the third switch by detecting a condition where the voltage value at the connection point is different from a power supply voltage of the power supply device, in a third combination condition where the first switch, the second switch, and the third switch are controlled to be OFF, and the fourth switch is controlled to be ON.

4. The charger having a failure detection function according to claim 1, wherein:
   the control device detects a failure of the first switch, the second switch, or the fourth switch by detecting a condition where the voltage value at the connection point is different from 0 V, in a second combination condition where the first switch, the second switch, and the fourth switch are controlled to be OFF, and the third switch is controlled to be ON.

5. The charger having a failure detection function according to claim 4, wherein:
   the control device detects a failure of the third switch on a condition where a voltage value at the connection point is different from a power supply voltage of the power supply device, in a third combination condition where the first switch, the second switch, and the third switch are controlled to be OFF, and the fourth switch is controlled to be ON.

6. A failure detection method, using a charger having a failure detection function that includes:
- a power supply device for outputting electric power for charging a secondary battery;
- a power supply path that includes a first switch and a second switch connected in series, and supplies the electric power from the power supply device to the secondary battery;
- a discharge circuit that includes a first resistor and a third switch connected in series, has a first end connected to a connection point between the first switch and the second switch, and has a second end connected to a ground line;
- a short-circuit preventing circuit that includes a second resistor and a fourth switch connected in series, and is connected in parallel to the first switch; and
- a control device that controls open-close of each switch and acquires a voltage value at the connection point,
- wherein the failure detection method comprises detecting a failure of each switch by detecting a condition where the voltage value at the connection point is different from a normal voltage value at the connection point for normal operation of each switch, in a combination of open-close control for each switch.

7. The failure detection method according to claim 6, wherein:
- a failure of the first switch, the second switch, or the fourth switch is detected by detecting a condition where the voltage value at the connection point is different from 0 V, in a first combination condition where all the switches are controlled to be OFF.

8. The failure detection method according to claim 7, wherein:
- a failure of the third switch is detected by detecting a condition where the voltage value at the connection point is different from a power supply voltage of the power supply device, in a third combination condition where the first switch, the second switch, and the third switch are controlled to be OFF, and the fourth switch is controlled to be ON.

9. The failure detection method according to claim 6, wherein:
- a failure of the first switch, the second switch, or the fourth switch is detected by detecting a condition where the voltage value at the connection point is different from 0 V, in a second combination condition where the first switch, the second switch, and the fourth switch are controlled to be OFF, and the third switch is controlled to be ON.

10. The failure detection method according to claim 9, wherein:
- a failure of the third switch is detected by detecting a condition where the voltage value at the connection point is different from a power supply voltage of the power supply device, in a third combination condition where the first switch, the second switch, and the third switch are controlled to be OFF, and the fourth switch is controlled to be ON.

* * * * *